United States Patent [19]

Sugimoto et al.

[11] 4,012,701
[45] Mar. 15, 1977

[54] HARTLEY OSCILLATOR

[75] Inventors: Takashi Sugimoto; Kazumasa Noyori, both of Yokohama, Japan

[73] Assignee: Tokyo Shibaura Electric Co., Ltd., Kawasaki, Japan

[22] Filed: Mar. 2, 1976

[21] Appl. No.: 663,154

[30] Foreign Application Priority Data

Mar. 5, 1975 Japan .............................. 50-26038

[52] U.S. Cl. .......................... 331/117 R; 331/171; 331/186
[51] Int. Cl.² .......................................... H03B 5/12
[58] Field of Search ............. 331/117 R, 167, 171, 331/170, 169, 185, 186

[56] References Cited

UNITED STATES PATENTS

| | | | |
|---|---|---|---|
| 3,319,179 | 5/1967 | Hepner | 331/117 |
| 3,396,345 | 8/1968 | Hoeppel | 331/117 |
| 3,732,503 | 5/1973 | Rapp | 331/117 |

OTHER PUBLICATIONS

Wireless World, Apr. 1968 "Wide-Range General Purpose Signal Generator" pp. 61–66, Nelson-Jones.

*Primary Examiner*—John Kominski
*Attorney, Agent, or Firm*—Finnegan, Henderson, Farabow & Garrett

[57] ABSTRACT

A Hartley oscillator includes a basic Hartley oscillation circuit having a semiconductor active element, a tank circuit coupled to the active element and having a grounded end, a coupling capacitor connected between the other end of the tank circuit and a control electrode of the active element. A constant direct current source for supplying a constant direct current to an electric current supply terminal of the active element is further provided. A feedback circuit is coupled to the active element and the output of the constant direct current source and adapted to cause a variation of a direct current potential on the current supply terminal of the active element to be fed back to the control electrode of the active element, and a capacitor having a grounded end and the other end connected to the output of the constant current source is further provided in the Hartley oscillator.

3 Claims, 3 Drawing Figures 4,012,701

HARTLEY OSCILLATOR

BACKGROUND OF THE INVENTION

This invention relates to a Hartley oscillator and in particular Hartley oscillator capable of exactly maintaining its oscillation frequency and oscillation amplitude constant.

A conventional typical Hartley oscillator includes a basic oscillation circuit 1 as shown in FIG. 1. The basic oscillation circuit 1 includes an active element, for example, an npn transistor 2, tank circuit 3 and coupling capacitor $C_2$. The tank circuit 3 includes a series circuit of inductive impedances $Z_1$ and $Z_2$, and a capacitive impedance $Z_3$ connected in parallel with the series circuit. The junction of the impedances $Z_1$ and $Z_2$ is connected to the emitter of the transistor 2. The junction of the impedances $Z_2$ and $Z_3$ are grounded. The coupling capacitor $C_2$ is connected between the base of the transistor 2 and the junction of the impedances $Z_1$ and $Z_3$.

A resistor $R_3$ is connected between the collector of the transistor 2 and a positive pole terminal 4 of a direct current powder source so as to suppress an abnormal oscillation current which flows into the transistor 2. A capacitor $C_1$ for lowering an AC impedance has one end connected to the junction between the terminal 4 and the resistor $R_3$. The other end of the capacitor $C_1$ is grounded. A voltage on the junction of series-connected resistors $R_1$ and $R_2$ coupled between the DC terminal 4 and ground is applied through a resistor R to the control electrode of the transistor 2.

If the constant of each part is so set as to satisfy the oscillation frequency requirements and oscillation output amplitude requirements, it is possible to obtain a Hartley oscillator. In the above-mentioned arrangement, however, when the various constants (for example, a current amplification constant) of the transistor are varied during oscillation (they generally tend to be varied), an emitter current is also varied. In consequence the oscillation frequency and amplitude output of the tank circuit 3 are also varied. In order to maintain the oscillation frequency and oscillation output of the oscillator constant it is generally required that electric current, i.e. emitter direct current of the transistor 2, flowing into the tank circuit 3 be maintained constant. It is known that in order to maintain the emitter current constant a resistor, not shown, for suppressing a variation of emitter current is connected between the emitter of the transistor and the tank circuit. Such a means is provided at the sacrifice of oscillation output.

It is accordingly the object of this invention to provide a Hartley oscillator capable of obtaining an oscillation output having a predetermined oscillation frequency and oscillation amplitude.

SUMMARY OF THE INVENTION

This invention provides a Hartley oscillator comprising a basic Hartley circuit including a semiconductor active element, a tank circuit coupled to the semiconductor active element and including a plurality of impedance elements and a grounded terminal, and a coupling capacitor coupled between a control electrode of the semiconductor active element and the other end of the tank circuit; a constant direct current source for supplying a constant current to said semiconductor active element through its direct current supply terminal; a feedback loop coupled to the semiconductor active element and the constant direct current source and adapted to detect a variation of a direct current potential on the direct current supply terminal and feed the variation of the direct current potential back to the control electrode of the semiconductor active element; and a capacitor having a grounded end and the other end coupled to the output of the constant direct current source.

PREFERRED EMBODIMENTS OF THE INVENTION

Figure 2:
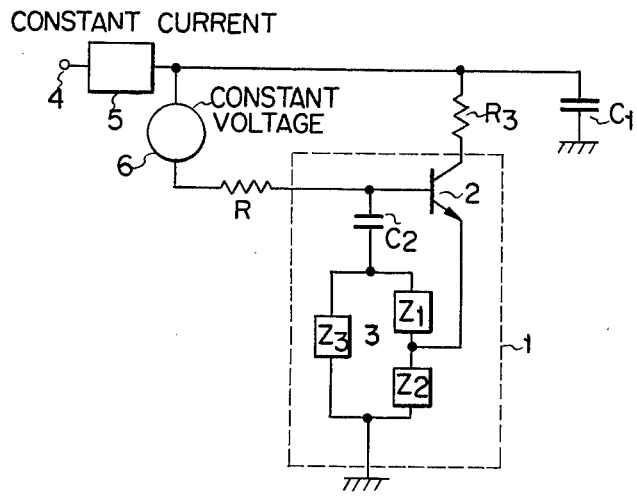
FIG. 2 is a circuit diagram showing one embodiment of this invention.
Figure 3:
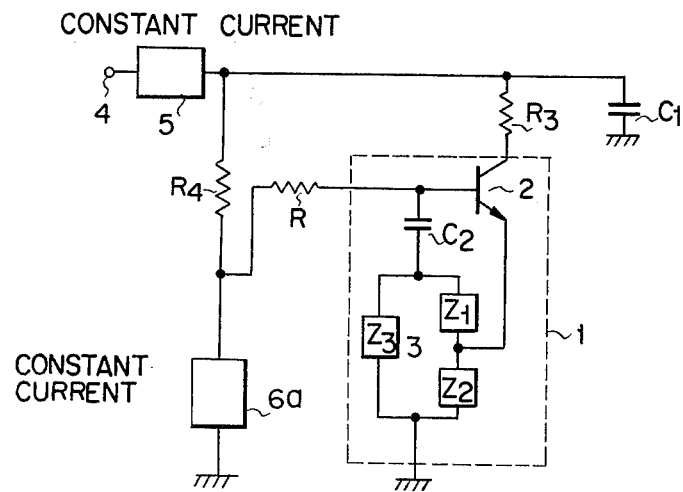
FIG. 3 is a circuit diagram showing another embodiment of this invention.

Like reference numerals are employed to designate like parts or elements in FIGS. 2 to 3.

In FIG. 2, DC constant current source 5 has an input terminal connected to a DC input terminal 4 and an output terminal connected through a resistor $R_3$ to the collector of an npn transistor 2. A DC constant voltage source 6 has one end connected to the output terminal of the constant direct current source 5 and the other terminal connected to the base of the transistor 2 through a resistor R. The arrangement of a tank circuit 3 having inductive impedance elements $Z_1$, $Z_2$ and capacitive impedance element $Z_3$ and a mutual connection of a coupling capacitor $C_2$ and transistor 2 are entirely the same as those shonw in FIG. 1 and any further explanation is therefore omitted. The output terminal of the constant direct current source 5 is connected to one end of a capacitor $C_1$, and the other end of the capacitor $C_1$ is grounded.

A series circuit of the resistor $R_3$, constant voltage source 6 and resistor R constitutes a feedback loop connected between the collector and the base of the transistor 2. A variation of direct current supplied to the tank circuit 3 from the emitter of the transistor 2 is detected as a variation of collector voltage. The variation of the collector voltage is fed back to the base of the transistor 2 through the resistor $R_3$, constant voltage source 6 and resistor R. In order to make the current into the transistor 2 further constant the constant current source 5 is provided. Even if various constants (for example, an amplification constant) of the transistor 2 are varied, the direct current flowing into the tank circuit 3 can be maintained constant by a combination of the constant current source 5 and above-mentioned feedback loop. By so doing the transistor 2 is always maintained in such a state that it can effect a normal operation as an oscillation transistor, and in consequence can supply constant current to the tank circuit 3.

Figure 1:
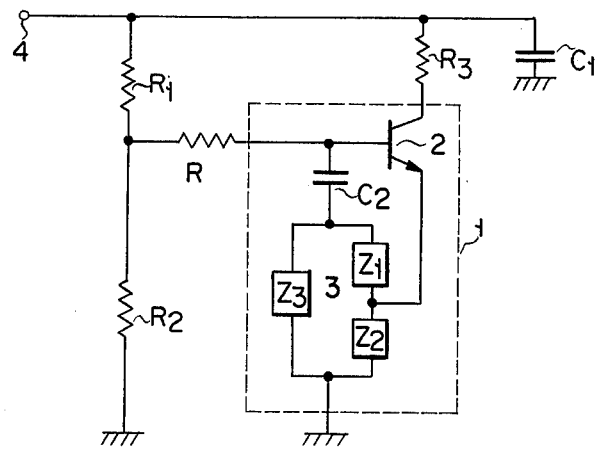
FIG. 1 is a view showing a conventional representative Hartley oscillator circuit.

In the prior art arrangement shown in FIG. 1 no feedback loop is provided and a constant voltage divided by the resistors $R_1$ and $R_2$ is merely applied to the base of the transistor 2 through the resistor R. Even if in this case a resistor (not shown) for suppressing the variation of electric current is connected between the emitter of the transistor and the junction of the impedances $Z_1$ and $Z_2$, it was found impossible that the oscillation frequency and oscillation amplitude could not be maintained satifactorily constant. If the above-mentioned resistor is so connected, there is involved a loss of energy supplied to the tank circuit, resulting in descreased oscillation output.

According to this invention, even when the various characteristics of the transistor (for example, current amplification constant) are varied, a constant direct current can always be supplied to the tank circuit and it is possible to obviate the need of providing such a resistor for suppressing the variation of the current. In consequence it is possible to provide a high output Hartley oscillator capable of maintaining the oscillation frequency and oscillation amplitude constant.

FIG. 3 shows another embodiment of this invention. In FIG. 3 a resistor $R_4$ and second direct constant current source 6a are provided between the output terminal of a first constant current source 5 and ground. The second constant current source 6a has a grounded end and the other end connected through a resistor R to the base of a transistor 2. In this embodiment a series circuit of the resistors $R_3$, $R_4$ and R constitutes a feedback loop. This embodiment has the same function and results as those of the embodiment in FIG. 2.

It is needless to say that a pnp type transistor can be used in place of the transistor 2. It is possible to use a field effect transistor having a source, drain and gate which correspond to the collector, emitter and base of the transistor, respectively.

What we claim is:

1. A Hartley oscillator comprises:
    a basic Hartley oscillation circuit including a semiconductor active element, a tank circuit coupled to the semiconductor active element and including a plurality of impedance elements and a grounded one terminal, and a coupling capacitor coupled between the control electrode of the active element and the other end of the tank circuit;
    a first constant direct current source for supplying a constant current to said active element through a direct current supply terminal of said active element;
    a feedback loop coupled to the output terminal of said first constant direct current source and adapted to cause a potential variation on the direct current supply terminal of said active element to be fed back to said control electrode; and
    a capacitor having a grounded end and the other end coupled to the output of the first constant current source.

2. The Hartley oscillator according to claim 1, in which said feedback loop includes a first resistor connected between the direct current supply terminal of said active element and the output of said first direct current source and a constant direct current voltage source connected, through a second resistor, between the control electrode of the active element and the output of the first constant direct current source.

3. The Hartley oscillator according to claim 1, in which said feedback loop includes a first resistor connected between the direct current supply terminal of the active element and the output of the first constant direct current source, a second resistor connected between the output of the first constant direct current source and one end of a second constant direct current source, the other end of said second constant direct being grounded, and a third resistor connected between the non-grounded end of the second constant direct current source and the control electrode of the active element.

* * * * *

UNITED STATES PATENT AND TRADEMARK OFFICE
CERTIFICATE OF CORRECTION

PATENT NO. : 4,012,701
DATED : March 15, 1977
INVENTOR(S) : Takashi Sugimoto; Kazumasa Noyori It is certified that error appears in the above-identified patent and that said Letters Patent are hereby corrected as shown below:

Claim 3, line 8, after "direct" add --current source--.

Signed and Sealed this

Twenty-fourth Day of May 1977

[SEAL]

Attest:

RUTH C. MASON
*Attesting Officer*

C. MARSHALL DANN
*Commissioner of Patents and Trademarks*